(12) United States Patent
Asadi et al.

(10) Patent No.: US 11,043,969 B2
(45) Date of Patent: Jun. 22, 2021

(54) FAST-CONVERGING SOFT BIT-FLIPPING DECODER FOR LOW-DENSITY PARITY-CHECK CODES

(71) Applicant: SK hynix Inc., Icheon-si (KR)

(72) Inventors: Meysam Asadi, Fremont, CA (US); Fan Zhang, Fremont, CA (US); Haobo Wang, San Jose, CA (US); Hongwei Duan, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/680,878

(22) Filed: Nov. 12, 2019

(65) Prior Publication Data
US 2021/0143837 A1 May 13, 2021

(51) Int. Cl.
*H03M 13/11* (2006.01)
*H03M 13/25* (2006.01)
*H03M 13/00* (2006.01)

(52) U.S. Cl.
CPC ...... *H03M 13/1111* (2013.01); *H03M 13/255* (2013.01); *H03M 13/6331* (2013.01)

(58) Field of Classification Search
CPC .................................................. H03M 13/1111
USPC .......................................................... 714/758
See application file for complete search history.

(56) References Cited

U.S. PATENT DOCUMENTS

| | | | | |
|---|---|---|---|---|
| 8,028,219 B2* | 9/2011 | Zhang | ............... | H03M 13/1148 714/767 |
| 8,301,960 B2* | 10/2012 | Zhang | ................. | H03M 13/255 714/752 |
| 8,689,092 B2* | 4/2014 | Sun | .................... | H03M 13/1148 714/800 |
| 9,548,764 B1 | 1/2017 | Chilappagari et al. | | |
| 2005/0283707 A1* | 12/2005 | Sharon | ................ | H03M 13/635 714/758 |
| 2014/0229792 A1 | 8/2014 | Varnica et al. | | |
| 2014/0281762 A1* | 9/2014 | Norrie | ................. | G06F 11/1012 714/703 |
| 2017/0272097 A1* | 9/2017 | Weng | ................. | H03M 13/1111 |
| 2018/0157551 A1* | 6/2018 | Ryabinin | ................. | G06F 1/04 |
| 2018/0159555 A1* | 6/2018 | Ryabinin | .......... | H03M 13/6577 |

* cited by examiner

*Primary Examiner* — Fritz Alphonse
(74) *Attorney, Agent, or Firm* — Perkins Coie LLP

(57) ABSTRACT

Disclosed are devices, systems and methods improving the convergence of a soft bit-flipping decoder in a non-volatile memory device. An example method includes receiving a noisy codeword, the codeword having been generated based on a parity check matrix of an LDPC code and provided to a communication channel prior to reception by the soft bit-flipping decoder, generating, based on the noisy codeword, one or more messages for passing between a plurality of variable nodes and a plurality of check nodes of the soft bit-flipping decoder, generating a reliability metric for each of the one or more messages, storing the reliability metric only for messages comprising magnitudes that are less than or equal to a predetermined threshold value; and performing, based on the one or more messages and the associated reliability metric for at least one of the one more messages, a single decoding iteration of the soft bit-flipping decoder.

20 Claims, 7 Drawing Sheets

FAST-CONVERGING SOFT BIT-FLIPPING DECODER FOR LOW-DENSITY PARITY-CHECK CODES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for ECCs that can provide data protection with improved convergence properties.

SUMMARY

Embodiments of the disclosed technology relate to methods, devices and systems for improving the convergence of a bit-flipping decoder for low-density parity-check (LDPC) codes that operates using soft information (denoted a soft bit-flipping decoder). The methods and devices described in the present document advantageously, among other features and benefits, enable faster convergence in bit-flipping decoding algorithms, thereby providing higher throughput and lower power consumption.

In an example aspect, a method for improving convergence of a soft bit-flipping decoder includes receiving a noisy codeword, the codeword having been generated based on a parity check matrix of a low-density parity-check (LDPC) code and provided to a communication channel prior to reception by the soft bit-flipping decoder, generating, based on the noisy codeword, one or more messages for passing between a plurality of variable nodes and a plurality of check nodes of the soft bit-flipping decoder, generating a reliability metric for each of the one or more messages, a magnitude of a message being indicative of a confidence level of its bit value in the codeword, storing the reliability metric only for messages comprising magnitudes that are less than or equal to a predetermined threshold value, and performing, based on the one or more messages and the associated reliability metric for at least one of the one or more messages, a single decoding iteration of the soft bit-flipping decoder.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Low-density parity-check (LDPC) codes are an important part of linear block error-correcting codes (ECCs), which have found widespread use in data storage systems. LDPC codes can be decoded by using two classes of decoding algorithms: soft-information message passing algorithms, e.g., min-sum or sum-product algorithms, and hard-decision algorithms such as bit-flipping algorithms. The soft-information decoding algorithms provide a very good decoding performance but require a large computation resources. They exhibit, therefore, very high complexity in hardware realization. On the contrary, the hardware implementations of hard-decision decoders were shown to have low complexity and reduced latency requirement because to the simple computation units and smaller connection networks, and have been developed to provide comparable error correction performance. In other systems, combinations of hard- and soft-decoding implementations are employed.

In most bit-flipping decoder architectures, the correction capability of a decoder is optimized so that is can correct more data and reduce the traffic going to the min-sum hard (MSH) decoder. However, based on data collected from thousands of NAND devices, this perspective may be inappropriate because correcting more data only marginally reduces the traffic to the MSH decoder. Thus, embodiments of the disclosed technology focus on, amongst other features and benefits, speeding up the convergence of a bit-flipping decoder that operates using soft information, thereby resulting in higher decoder throughput, lower power consumption requirements, and improved performance (compared to a hard-decision bit-flipping decoder).

FIGS. 1-6 overview a non-volatile memory system in which embodiments of the disclosed technology may be implemented.

Figure 1:
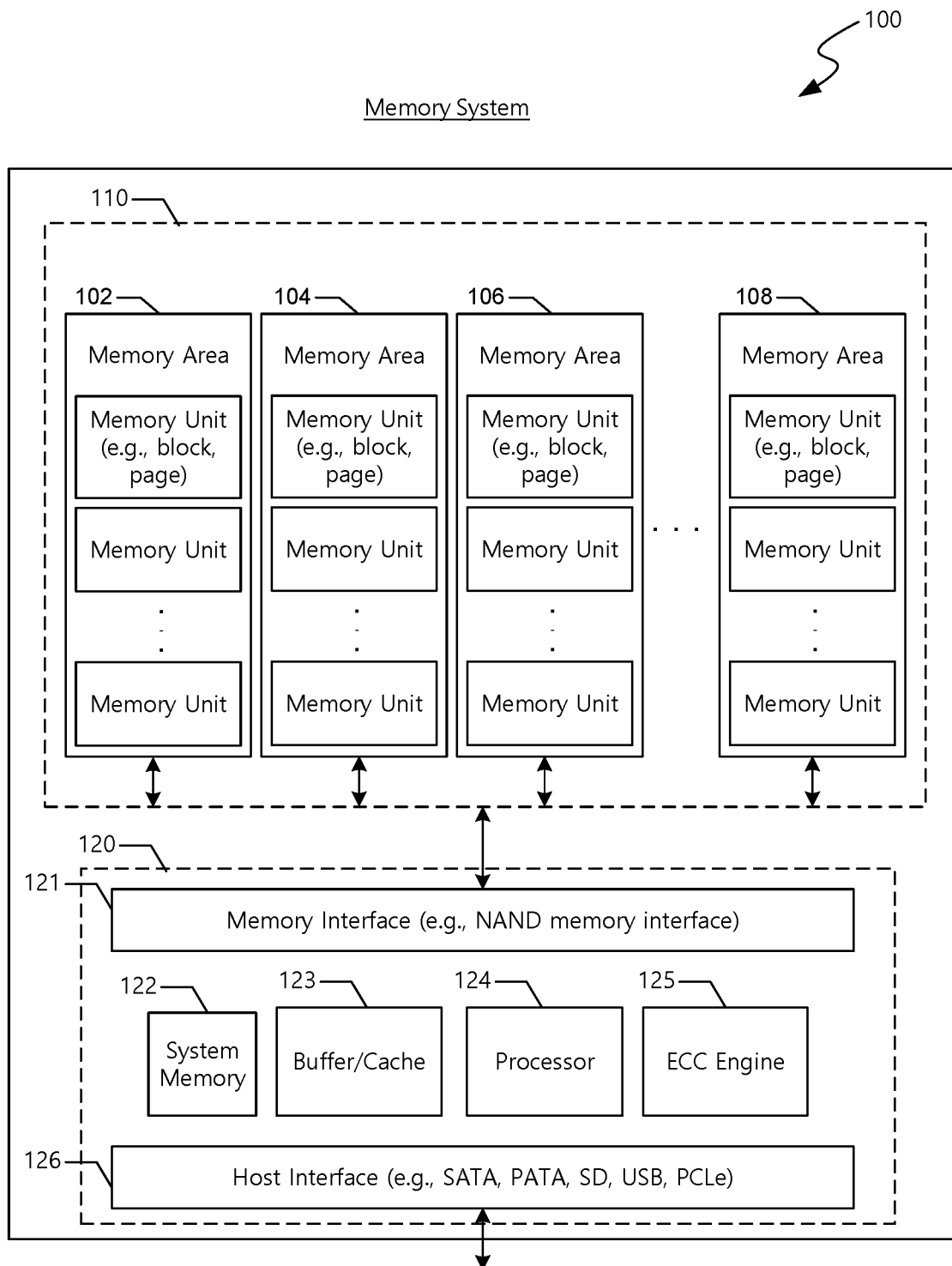
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
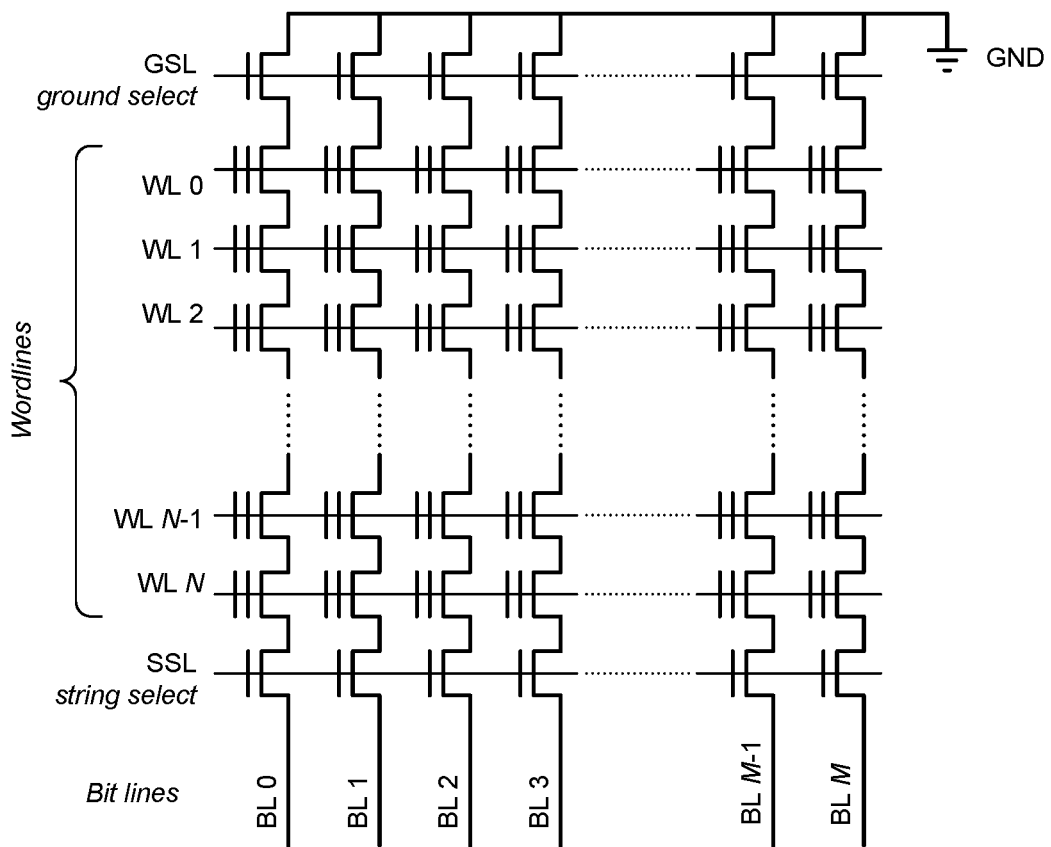
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
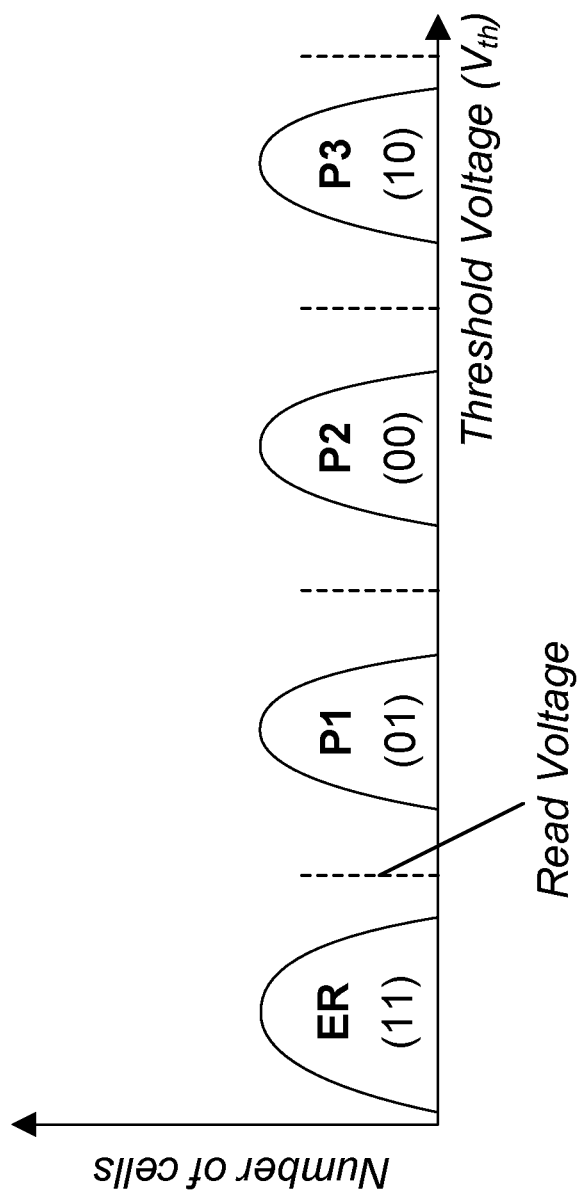
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
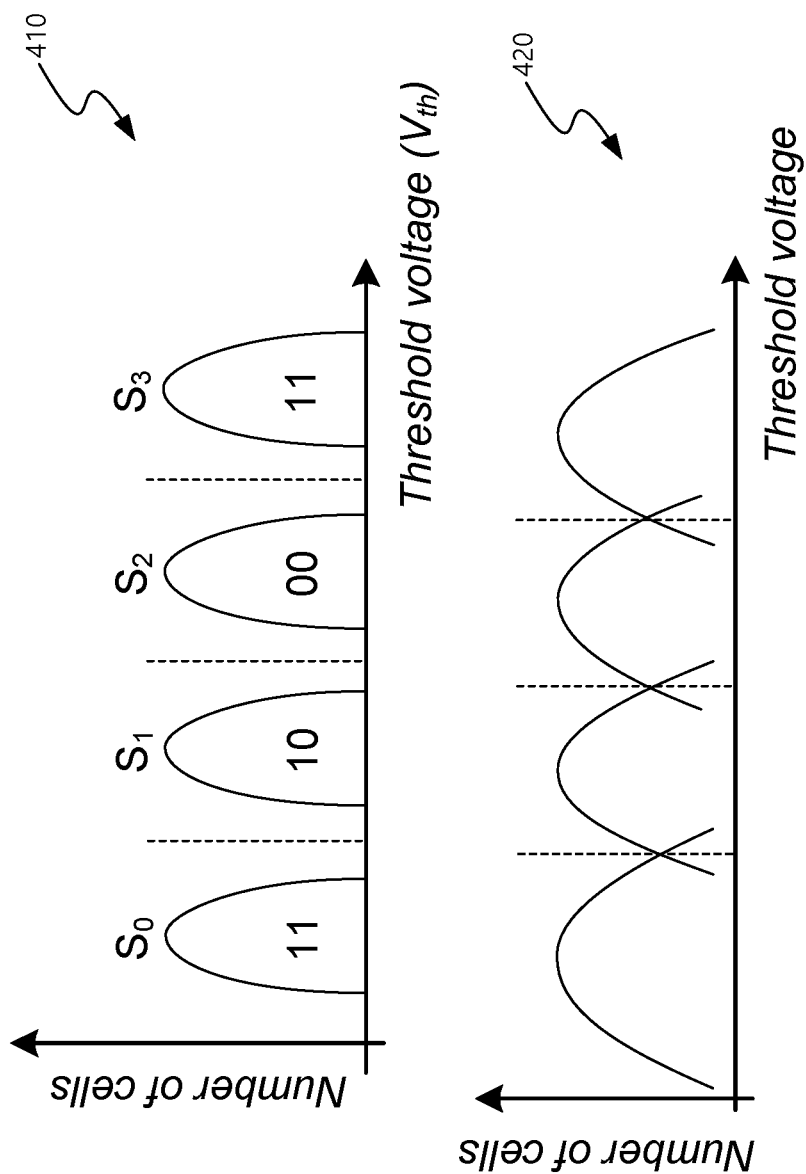
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
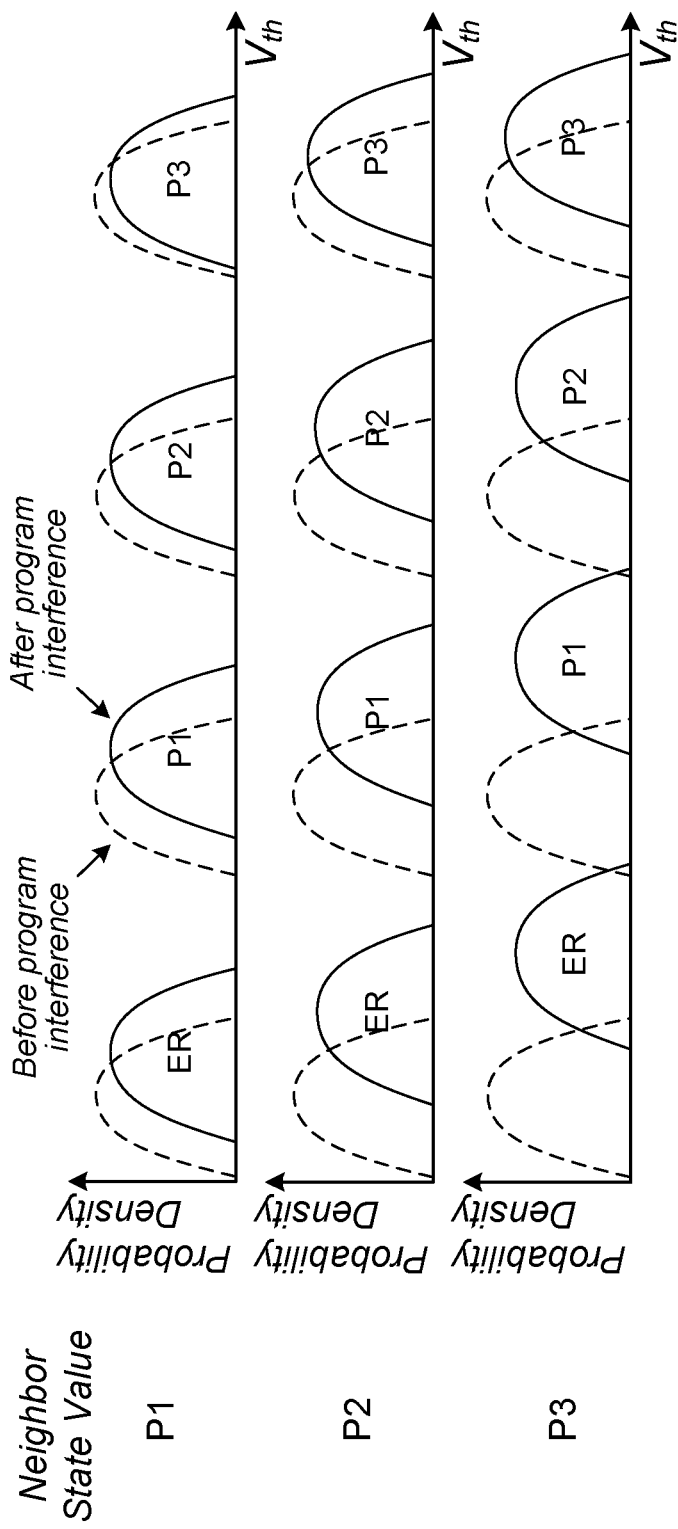
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
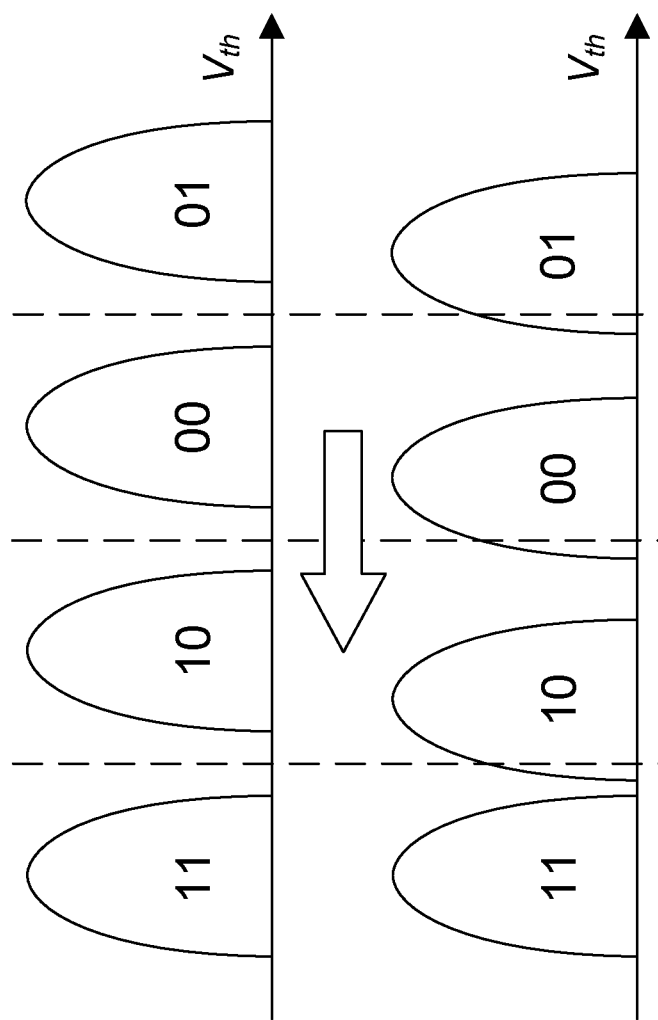
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

An exemplary operation of the bit-flipping decoder in an exemplary NAND device (e.g., the NAND device described in the context of FIGS. 1-6) assumes that $x=[x_0, x_1, \ldots, x_{N-1}]$ is a bit vector and $H=[h_{ij}]$ is an M×N low-density parity-check matrix with a binary value $h_{ij}$ at row i and column j, and with each row of H providing a parity check for x. If x is a codeword of H, then $xH^T=0$. It is further assumed that x is transmitted over a noisy channel and that the output of the channel is $y=[y_0, y_1, \ldots, y_{N-1}]$, which is processed by the receiver. The parity-check matrix of an LDPC code can be represented by a bipartite graph called a Tanner graph that is composed of two groups of nodes: checks nodes and variable nodes.

In an example, the receiver computes the syndrome of y as a binary vector calculated as $s=[s_0, s_1, \ldots, s_{N-1}]=yH^T$, with the weight of s (denoted $\|s\|$ and equivalent to the number of "1" entries in s) representing the number of unsatisfied check nodes. Furthermore, the number of unsatisfied check nodes connected with variable node j is denoted $\|s_j\|$.

An example algorithm for improving convergence of a bit-flipping decoder, according to embodiments of the disclosed technology, assumes E(i) is the flipping energy (or indicator) of the i-th column, T is the flipping threshold, s is the syndrome, t is the iteration index (or number) such that $(0 \leq t \leq t_{max})$, $d_j^{(t)}$ denotes the decision of variable node j of the t-th iteration, and $$d^{(t)} = [d_0^{(t)}, d_1^{(t)}, \ldots, d_{N-1}^{(t)}] \cdot s^{(t)} = [d_0^{(t)}, d_1^{(t)}, \ldots, d_{N-1}^{(t)}]H^T.$$

Lastly, if it is assumed that $d^{(-1)} = [d_0^{(-1)}, d_0^{(-1)}, \ldots, d_{N-1}^{(-1)}] = y$, then $s^{(-1)} = yH^T$.

In some embodiments, the iterative decoding algorithm is described as follows:

Operation 0: Set t=0, calculate $s^{(-1)}$ and go to Operation 1;

Operation 1: If max iteration exceeded, stop decoding. Else, go to Operation 2;

Operation 2: If s=0, stop decoding. Otherwise, go to Operation 3;

Operation 3: For $0 \leq j \leq N-1$, perform the following operations:

update the flipping indicator (or energy), E(j);
update the flipping threshold, T;
flip the j-th bit if E(j)>T;
compute and update s; and
go to Operation 1.

In some embodiments, the flipping indicator E(j) is updated as follows:

if $d_j^{(t)} = y_j$, then $E(j) = \|s_j\|$; otherwise, $E(j) = \|s_j\| + \alpha$.

Herein, a can be any positive value. For example, if a is set to 1, $E(j) = \|s_j\| + 1$ when $d_j^{(t)} \neq y_j$.

In some embodiments, the adaptive flipping threshold T is generated based on the iteration number, the number of unsatisfied check nodes of the previous iteration, and/or the number of variable nodes flipped in the previous iteration.

In some embodiments, the error correction mechanism flips a single bit. In other embodiments, errors are corrected by flipping multiple bits.

Embodiments of the disclosed technology augment the implementation described above by using an additional bit at both the variable nodes and check nodes to represent the reliability of their corresponding messages, which advantageously improves the error correction capability of the bit-flipping decoder.

In some embodiments, the reliability bit is stored only for a subset of the variable node to check node (V2C) messages, thereby reducing the memory footprint and power consumption of the described implementations. In other embodiments, and similar to the implementation described above, the flipping thresholds are adapted within an iteration to ensure convergence of the decoding operation remains as fast as possible.

In some embodiments, and maintaining the notation in the example described above, the iterative decoding algorithm for a soft bit-flipping decoder is described as follows:

Operation 0: Set t=0, calculate $s^{(-)}$, store the decoder reliability R[N−1:0] by comparing the magnitude with a predetermined threshold α, and go to Operation 1;

Operation 1: If max iteration exceeded, stop decoding. Else, go to Operation 2;

Operation 2: If s=0, stop decoding. Otherwise, go to Operation 3;

Operation 3: For 0≤j≤N−1, perform the following operations:

compute the flipping indicator (or energy), $$E[j]=2(d^{(t)}[j]\oplus d^{-1}[j])-1+\Sigma(2s_j-1)$$

update the flipping thresholds, T1 and T2
based on R[j] and E[j], decide whether to flip d[j] or not
  flip d[j] if R[j] is reliable and E[j]≥T1
  flip d[j] if R[j] is unreliable and E[j]≥T2
modify R[j] based on the following rules:
  if R[j] is unreliable and E[j]≥T1, R[j] becomes reliable
  if R[j] is reliable and T2<E[j]<T1, R[j] becomes unreliable
  Otherwise, the status of R[j] remains unchanged In Operation 3, E[j] is computed based on $(d^{(t)}[j]\oplus d^{-1}[j])$, which is the XOR operation performed on the current value (in this iteration) of d[j] and the initial value of d[j], and $(2s_j-1)$, where $s_j$ is the j-th bit of the syndrome s. The first term increases E[j] if the bit d[j] has flipped since the first iteration, and the second term increases E[j] when the parity check associated with $S_j$ is violated. Thus, the comparison of E[j] to the first flipping threshold (T1) and/or the second flipping threshold (T2) is used to determine whether d[j] should be flipped.

In some embodiments, the flipping thresholds T1 and T2 are generated based on the iteration number, the number of unsatisfied check nodes of the previous iteration, and/or the number of variable nodes flipped in the previous iteration.

Figure 7:
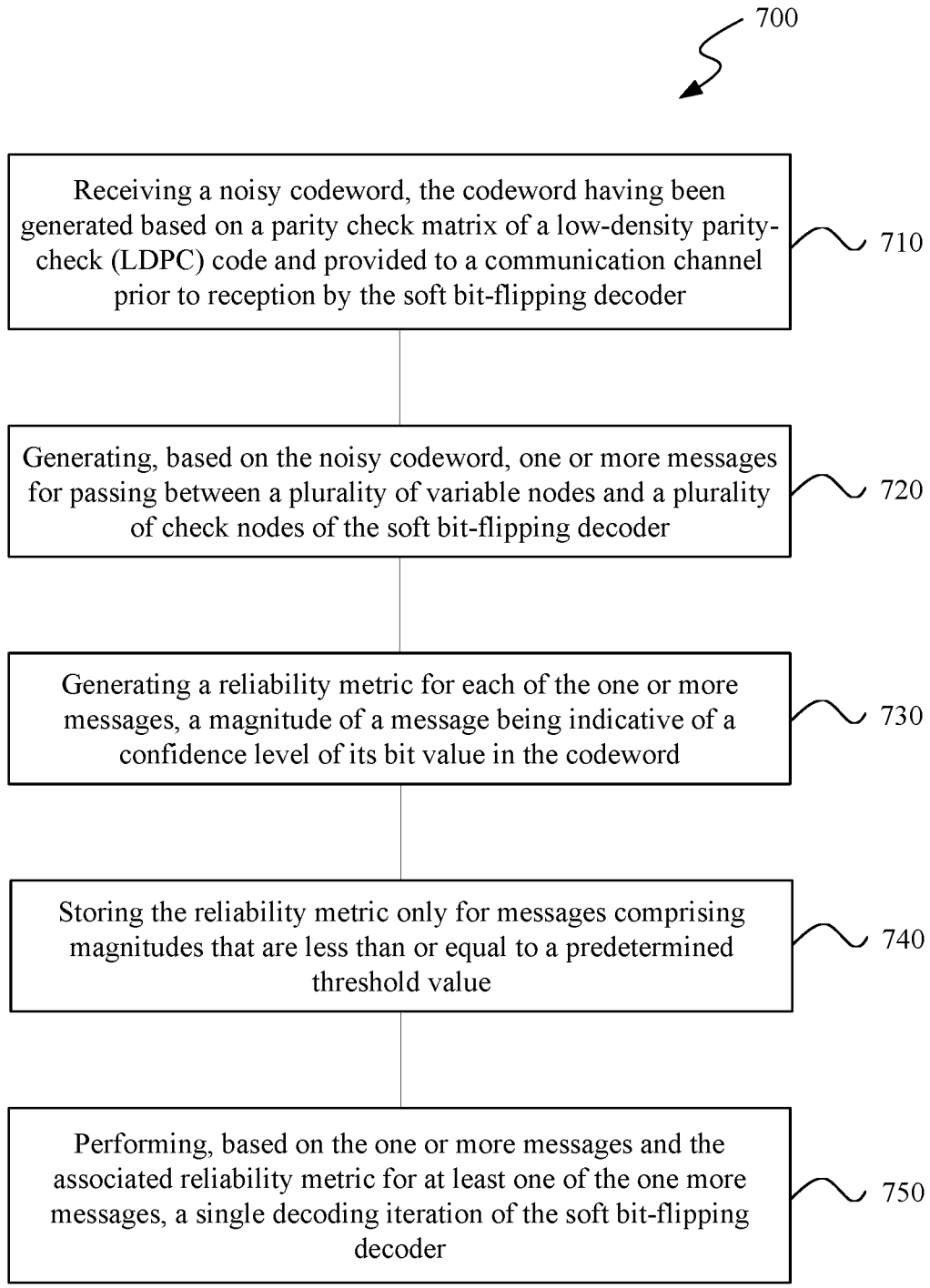
FIG. 7 illustrates a flowchart of another example method for improving convergence of a bit-flipping decoder.

FIG. 7 illustrates a flowchart of an example method for improving the convergence of a soft bit-flipping decoder. The method 700 includes, at operation 710, receiving a noisy codeword, the codeword having been generated based on a parity check matrix of a low-density parity-check (LDPC) code and provided to a communication channel prior to reception by the soft bit-flipping decoder.

The method 700 includes, at operation 720, generating, based on the noisy codeword, one or more messages for passing between a plurality of variable nodes and a plurality of check nodes of the soft bit-flipping decoder.

The method 700 includes, at operation 730, generating a reliability metric for each of the one or more messages, a magnitude of a message being indicative of a confidence level of its bit value in the codeword.

The method 700 includes, at operation 740, storing the reliability metric only for messages comprising magnitudes that are less than or equal to a predetermined threshold value.

The method 700 includes, at operation 750, performing, based on the one or more messages and the associated reliability metric for at least one of the one more messages, a single decoding iteration of the soft bit-flipping decoder.

In some embodiments, the decoding iteration spans a plurality of stages, and performing the single decoding iteration includes, for each of the plurality of stages: computing a flipping metric corresponding to a single column of the parity check matrix; flipping at least one bit in the single column based on the corresponding reliability metric and a comparison of the flipping metric to a first flipping threshold and a second flipping threshold; computing, subsequent to the flipping, a syndrome as a product of the noisy codeword and the parity check matrix; and updating, upon a determination that the syndrome is not zero, the first flipping threshold, the second flipping threshold and the reliability metric.

In some embodiments, updating the first flipping threshold or the second flipping threshold is obtained based on an index of the decoding iteration, a number of non-zero values in the syndrome, or a number of bits flipped in a column of the parity check matrix in a previous decoding iteration.

In some embodiments, updating the first flipping threshold for a first stage of the plurality of stages is based on a first set of rules, and wherein updating the first flipping threshold for a second stage subsequent to the first stage is based on a second set of rules different from the first set of rules.

In some embodiments, updating the reliability metric is based on a current value of the reliability metric and a comparison of the flipping metric to the first flipping threshold or the second flipping threshold.

In some embodiments, each stage of the plurality of stages corresponds to a predetermined number of clock cycles.

In some embodiments, storing the reliability metric only for the messages that comprise a magnitude that is less than or equal to the predetermined threshold value results in a lower memory footprint for the soft bit-flipping decoder compared to storing the reliability metric for each of the one or more messages.

In some embodiments, the reliability metric is a one-bit reliability metric.

In some embodiments, the predetermined threshold value is selected such that the messages that comprise a magnitude that is less than or equal to the predetermined threshold value corresponding to a predetermined percentage of the one or more messages.

In some embodiments, the predetermined percentage is 5%, 10%, 15% or 20%.

Typically a single bit-flipping decoder iteration operates over several clock cycles (e.g., number of clock cycles, K>>1), and the bit-flipping threshold (amongst other parameters) is only updated after an iteration is completed, i.e., the decoder parameters are updated for the next multi clock cycle iteration if the iteration index has not exceeded the maximum number of iterations. Embodiments of the disclosed technology update the bit-flipping threshold after a predetermined number of clock cycles (e.g., K=1, 2, 5 and so on), which is configured to occur in the middle of an iteration.

The use of LDPC codes in data storage systems are typically configured for operation at a signal-to-noise ratio (SNR) that is higher than the typical wireless channel. Consequently, the number of errors encountered in the received (or read) codeword are fewer than in the case of a wireless channel. Thus, embodiments of the disclosed technology are configured to perform LDPC bit-flipping decoding operations at time increments smaller than a complete iteration (e.g., per clock cycle or per a predetermined number of clock cycles). This ensures that if a codeword only has 1-2 bit errors, and they get corrected after processing the first few columns, then the remainder of the iteration is not be completed as in a conventional bit-flipping decoder because the checksum and syndrome is checked after each bit-flipping operation. This advantageously increases the decoder throughput and reduces power consumption.

The high SNR operating point advantageously enables the soft bit-flipping decoder to be implemented in a smaller memory footprint and with reduced power consumption because the reliability bits are stored only for the weak bits (or locations) of the codeword, as compared to storing a reliability metric (that may include one or more bits) for every bit of the codeword as is the case in conventional soft decoding algorithms for wireless communication systems.

In an example, and based on tests of hundreds of NAND devices, the efficacy of the soft bit-flipping decoder is not significantly impacted if the number of bits used to transfer V2C messages is reduced from 2 bits/message (e.g., the case where a reliability bit is stored for each codeword bit) to 1.1 bits/message, wherein the reliability bit is stored for approximately 10% of the codeword bits. This correspondingly reduces the required memory by approximately 90%.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., FPGA (field programmable gate array) or ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving convergence of a soft bit-flipping decoder, comprising:
   receiving, by the soft bit-flipping decoder, a noisy codeword, the codeword having been generated based on a parity check matrix of a low-density parity-check (LDPC) code and provided to a communication channel prior to reception by the soft bit-flipping decoder;
   generating, by the soft bit-flipping decoder and based on the noisy codeword, one or more messages for passing between a plurality of variable nodes and a plurality of check nodes of the soft bit-flipping decoder;
   generating, by the soft bit-flipping decoder, a reliability metric for each of the one or more messages, a magnitude of a message being indicative of a confidence level of its bit value in the codeword;
   storing the reliability metric only for messages comprising magnitudes that are less than or equal to a predetermined threshold value; and
   performing, by the soft bit-flipping decoder and based on the one or more messages and the associated reliability metric for at least one of the one or more messages, a single decoding iteration of the soft bit-flipping decoder.

2. The method of claim 1, wherein the decoding iteration spans a plurality of stages, and wherein, performing the single decoding iteration includes, for each of the plurality of stages:

computing, by the soft bit-flipping decoder, a flipping metric corresponding to a single column of the parity check matrix;

flipping, by the soft bit-flipping decoder, at least one bit in the single column based on the corresponding reliability metric and a comparison of the flipping metric to a first flipping threshold and a second flipping threshold;

computing, by the soft bit-flipping decoder and subsequent to the flipping, a syndrome as a product of the noisy codeword and the parity check matrix; and updating, by the soft bit-flipping decoder and upon a determination that the syndrome is not zero, the first flipping threshold, the second flipping threshold and the reliability metric.

3. The method of claim 2, wherein updating the first flipping threshold or the second flipping threshold is obtained based on an index of the decoding iteration, a number of non-zero values in the syndrome, or a number of bits flipped in a column of the parity check matrix in a previous decoding iteration.

4. The method of claim 2, wherein updating the first flipping threshold for a first stage of the plurality of stages is based on a first set of rules, and wherein updating the first flipping threshold for a second stage subsequent to the first stage is based on a second set of rules different from the first set of rules.

5. The method of claim 2, wherein updating the reliability metric is based on a current value of the reliability metric and a comparison of the flipping metric to the first flipping threshold or the second flipping threshold.

6. The method of claim 2, wherein each stage of the plurality of stages corresponds to a predetermined number of clock cycles.

7. The method of claim 1, wherein storing the reliability metric only for the messages that comprise magnitudes less than or equal to the predetermined threshold value results in a lower memory footprint for the soft bit-flipping decoder compared to storing the reliability metric for each of the one or more messages.

8. The method of claim 1, wherein the reliability metric is a one-bit reliability metric.

9. The method of claim 1, wherein the predetermined threshold value is selected such that the messages that comprise a magnitude that is less than or equal to the predetermined threshold value corresponding to a predetermined percentage of the one or more messages.

10. The method of claim 9, wherein the predetermined percentage is 5%, 10%, 15% or 20%.

11. A system for improving convergence of a soft bit-flipping decoder in a non-volatile memory device, comprising:

a processor and a memory including instructions stored thereupon, wherein the instructions upon execution by the processor cause the processor to:

receive a noisy codeword, the codeword having been generated based on a parity check matrix of a low-density parity-check (LDPC) code and provided to a communication channel prior to reception by the soft bit-flipping decoder;

generate, based on the noisy codeword, one or more messages for passing between a plurality of variable nodes and a plurality of check nodes of the soft bit-flipping decoder;

generate a reliability metric each of the one or more messages, the magnitude of a message being indicative of a confidence level of its bit value in the codeword;

store the reliability metric only for messages comprising magnitudes that are less than or equal to a predetermined threshold value; and perform, based on the one or more messages and the associated reliability metric for at least one of the one more messages, a single decoding iteration of the soft bit-flipping decoder.

12. The system of claim 11, wherein the decoding iteration spans a plurality of stages, and wherein, for each of the plurality of stages, the processor is further configured, as part of performing the single decoding iteration, to:

compute a flipping metric corresponding to a single column of the parity check matrix;

flip at least one bit in the single column based on the corresponding reliability metric and a comparison of the flipping metric to a first flipping threshold and a second flipping threshold;

compute, subsequent to the flipping, a syndrome as a product of the noisy codeword and the parity check matrix; and update, upon a determination that the syndrome is not zero, the first flipping threshold, the second flipping threshold and the reliability metric.

13. The system of claim 12, wherein updating the first flipping threshold or the second flipping threshold is obtained based on an index of the decoding iteration, a number of non-zero values in the syndrome, or a number of bits flipped in a column of the parity check matrix in a previous decoding iteration.

14. The system of claim 11, wherein storing the reliability metric only for the messages that comprise magnitudes less than or equal to the predetermined threshold value results in a lower memory footprint for the soft bit-flipping decoder compared to storing the reliability metric for each of the one or more messages.

15. The system of claim 11, wherein the reliability metric is a one-bit reliability metric.

16. A non-transitory computer-readable storage medium having instructions stored thereupon for improving convergence of a soft bit-flipping decoder in a non-volatile memory device, comprising:

instructions for receiving a noisy codeword, the codeword having been generated based on a parity check matrix of a low-density parity-check (LDPC) code and provided to a communication channel prior to reception by the soft bit-flipping decoder;

instructions for generating, based on the noisy codeword, one or more messages for passing between a plurality of variable nodes and a plurality of check nodes of the soft bit-flipping decoder;

instructions for generating a reliability metric for each of the one or more messages, the magnitude of a message being indicative of a confidence level of its bit value in the codeword;

instructions for storing the reliability metric only for messages comprising magnitudes that are less than or equal to a predetermined threshold value; and instructions for performing, based on the one or more messages and the associated reliability metric for at least one of the one more messages, a single decoding iteration of the soft bit-flipping decoder.

17. The computer-readable storage medium of claim 16, wherein the decoding iteration spans a plurality of stages, and wherein the instructions for performing the single decoding iteration include, for each of the plurality of stages:
   instructions for computing a flipping metric corresponding to a single column of the parity check matrix;
   instructions for flipping at least one bit in the single column based on the corresponding reliability metric and a comparison of the flipping metric to a first flipping threshold and a second flipping threshold;
   instructions for computing, subsequent to the flipping, a syndrome as a product of the noisy codeword and the parity check matrix; and
   instructions for updating, upon a determination that the syndrome is not zero, the first flipping threshold, the second flipping threshold and the reliability metric.

18. The computer-readable storage medium of claim 17, wherein updating the first flipping threshold or the second flipping threshold is obtained based on an index of the decoding iteration, a number of non-zero values in the syndrome, or a number of bits flipped in a column of the parity check matrix in a previous decoding iteration.

19. The computer-readable storage medium of claim 16, wherein storing the reliability metric only for the messages that comprise magnitudes less than or equal to the predetermined threshold value results in a lower memory footprint for the soft bit-flipping decoder compared to storing the reliability metric for each of the one or more messages.

20. The computer-readable storage medium of claim 16, wherein the reliability metric is a one-bit reliability metric.

* * * * *